(12) United States Patent
Bruno et al.

(10) Patent No.: US 6,809,509 B2
(45) Date of Patent: Oct. 26, 2004

(54) ELECTRICAL MONITORING SYSTEM

(75) Inventors: David Bruno, Portland, OR (US);
Marc Bowman, McMinnville, OR
(US); Rodrick Seely, Sherwood, OR
(US)

(73) Assignee: Veris Industries, LLC, Portland, OR (US)

( * ) Notice: Subject to any disclaimer, the term of this patent is extended or adjusted under 35 U.S.C. 154(b) by 44 days.

(21) Appl. No.: 10/106,976

(22) Filed: Mar. 25, 2002

(65) Prior Publication Data

US 2003/0178986 A1 Sep. 25, 2003

Related U.S. Application Data
(60) Provisional application No. 60/334,971, filed on Nov. 30, 2001.

(51) Int. Cl.[7] ............................. G01R 1/04; G01R 19/00
(52) U.S. Cl. ........................ 324/157; 324/127; 324/107
(58) Field of Search ................................ 324/127, 107, 324/103 R, 115, 157; 361/627, 641, 663; 312/223.6

(56) References Cited

U.S. PATENT DOCUMENTS

| | | | | |
|---|---|---|---|---|
| 5,861,683 A | * | 1/1999 | Engel et al. | 307/38 |
| 5,880,677 A | * | 3/1999 | Lestician | 340/3.1 |
| 5,995,911 A | * | 11/1999 | Hart | 702/64 |
| 6,064,192 A | * | 5/2000 | Redmyer | 324/127 |
| 6,373,238 B2 | | 4/2002 | Lewis et al. | 324/107 |
| D466,078 S | * | 11/2002 | Bowman | D13/123 |

* cited by examiner

Primary Examiner—Anjan Deb
(74) Attorney, Agent, or Firm—Chernoff, Vilhaufer, McClung & Stenzel, LLP

(57) ABSTRACT

An electrical sensing device that includes a support and sensors supported by the support in a fixed spatial relationship.

16 Claims, 7 Drawing Sheets

LEFT CT STRIP

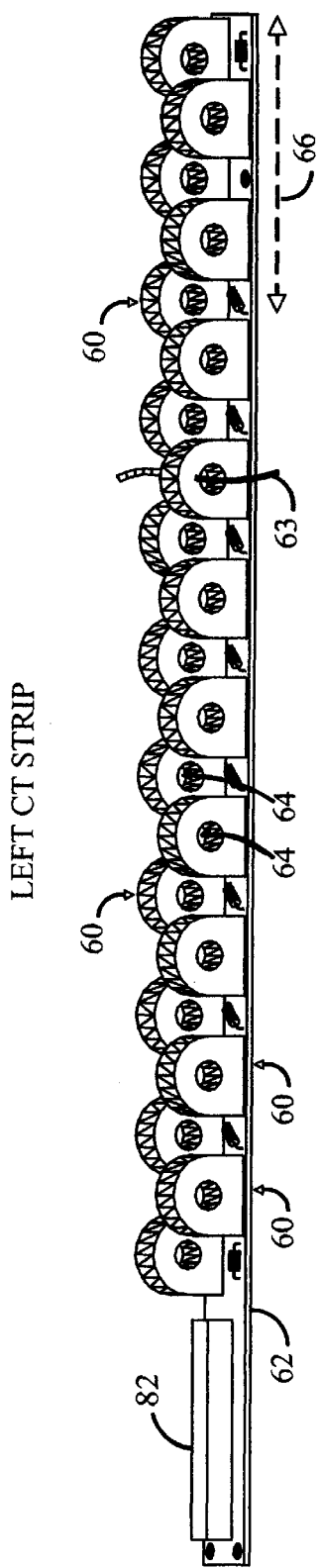
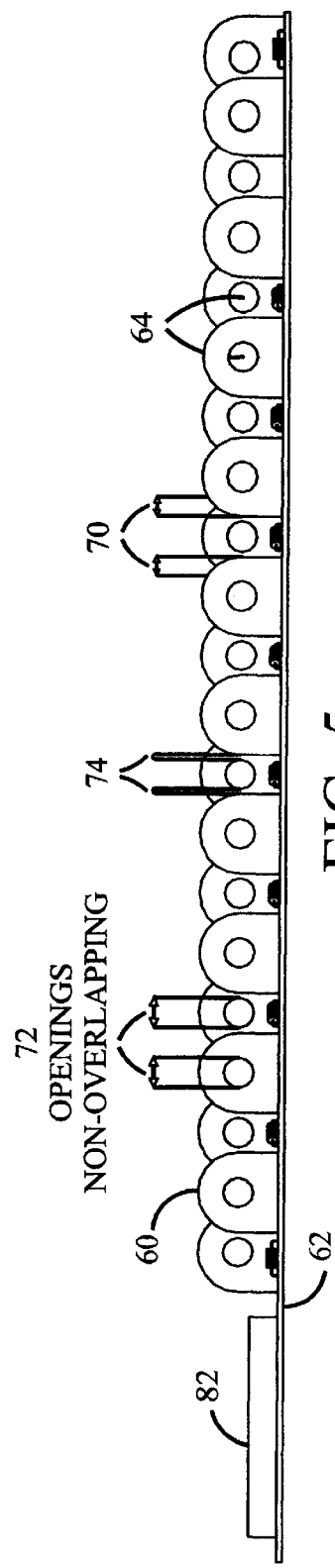
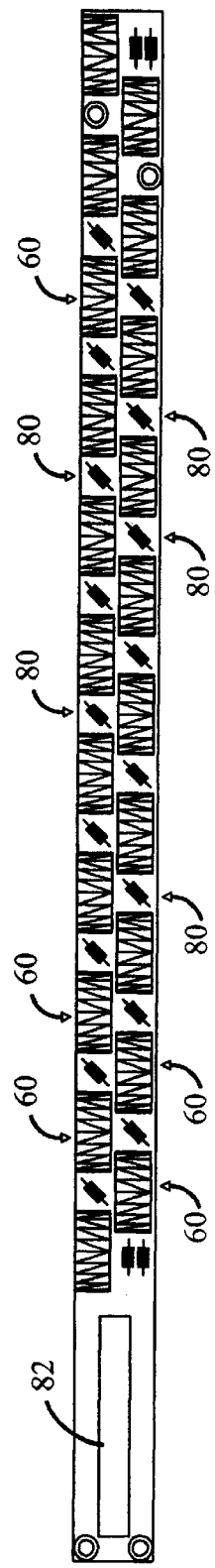
FIG. 4
FIG. 5
FIG. 6

RIGHT CT STRIP

ELECTRICAL MONITORING SYSTEM

This application claims the benefit of U.S. patent application Ser. No. 60/334,971, filed on Nov. 30, 2001.

BACKGROUND OF THE INVENTION

The present invention relates to an electrical monitoring system.

Referring to FIG. 1, many electrical power distribution systems include a power panel enclosure 10 into which is provided electrical power using one or more sets of wires 12. The electrical power may have any voltage, any current, and any number of phases (e.g., single phase, two phases, or three phases). Each phase of the electrical power to the power panel is normally provided to a separate bus bar 14a, 14b, and 14c, which are normally elongate conductors within the power panel 10. A plurality of circuit breakers 16a, 16b, 16c, etc., which trip or otherwise selectively disconnect electrical power, are electrically interconnected between one or more of the bus bars 14a, 14b, and 14c, and respective loads 18 external to the power panel 10. In many power panels 10 the circuit breakers 16 are vertically aligned in one or more strips 20 and 22. When the load 18 interconnected to a respective circuit breaker 16 within the power panel 10 draws excessive electrical current then the circuit break 16 trips or otherwise disconnects the electrical power to the load 18. In this manner, if a load shorts and thereafter draws excessive current then the circuit breaker will trip.

In a business or residential environment a set of electrical loads, such as motors, outlets, heaters, lights, machinery, instrumentation, etc., may be electrically interconnected to a single circuit. When the electrical current provided to the loads from a single circuit is excessive then the respective circuit breaker(s) will disconnect the electrical power to all of the loads. Initially, the anticipated current requirements for all of the loads interconnected to a single circuit breaker (s) may be added together to ensure that the total load will be sufficiently below the rating for the circuit breaker. In this manner, the circuit breaker will not inadvertently trip with normal variations in the current drawn by the loads. However, after the initial installation of the loads and a suitable circuit breaker for those loads, additional loads are frequently added to existing circuits without sufficient consideration of the total existing load for the respective circuit breaker(s). If excessive additional loads are added to the circuit breaker(s), then the circuit breaker(s) will have a tendency to trip during normal operation. While this may be generally acceptable in a residential environment, in a business environment the unanticipated tripping of the circuit breaker, especially when none of the loads are actually shorted, is simply unacceptable.

For example, in a computer server farm environment five circuit breakers may each be electrically interconnected to five computer servers, having a total of twenty-five computer servers. If three additional computer servers are added to the computer server farm, they may be electrically interconnected to the same circuit breaker. Frequently the installer is in a hurry to install the three additional computer servers to the network and interconnects the additional three computer servers to any readily available power outlet. However, having eight computer servers electrically interconnected to a single circuit breaker, which is properly sized for only five computer servers, will likely result in tripping the circuit breaker during normal usage. This may be simply unacceptable for operating a computer server farm where uninterrupted service is important. In many cases, the power provider to the server farm guarantees up time of the power provided to the computer servers. In the event that the power is interrupted, the power provider may be required to pay a substantial financial penalty.

Referring to FIG. 2, to monitor the current levels of individual circuit breakers 16 a respective current sensor 20 may be interconnected to the wire on the load side of the respective circuit breaker 16. The outputs 22 of each of the current sensors 20 may be interconnected to a current monitor 24 which signals an alarm condition if the output of one of the current sensors is to high. The current sensors 20 may be interconnected to one or more current monitors. It takes considerable time to install, at significant expense, all of the current sensors 20 and the available space within the power panel 10 may be insufficient for the desired number of current sensors. Also, the limited space available along the circuit breakers 16 may result in significant difficulty installing the current sensors 20, thus requiring lateral spacing of the current sensors and bending the wires from the circuit breakers to different locations within the power panel 10 in an attempt to locate sufficient available space for the current sensors 20. In addition, the large number of wires 22 from the current sensors 20 to the current monitor 24 may require considerable space within the power panel 10. Further, because of the significant number of individual wires 22 an installer has a significant tendency to interconnect the wires 22 to improper places within the current monitor 24 and in particular to mismatch pairs of wires 22 from the same current sensor 20 rending the current sensors 20 ineffective. Moreover, it is problematic to ensure that the wires 22 indicated by the installer that relate to a particular current sensor 20 actually are interconnected to the desired current sensor 20. In summary, the potential installation problems are significant, especially when install by untrained technicians.

Referring to FIG. 3, a design sold by Veris Industries, LLC is a three phase current sensor 40. A set of separate housings 42a, 42b, and 42c enclose respective single phase current sensors and related electronics. The separate housings 42a–42c are glued together to create a three phase current sensor. A set of wires, each of which have a single electrical phase 46a, 46b, and 46c of a three phase circuit is inserted through the current sensors within the respected housings 42a, 42b, and 42c. The output of each of the current sensors is a current proportional to the current in the respective wire 46a–46c. The current sensor within each of the housings 42a–42c are interconnected in series providing a single pair of outputs 44. If the current in one of the phases of the three phase circuit is over a threshold, then the respective current sensor provides an open circuit condition at its respective terminals. If one of the current sensors is open circuited then that condition is reflected at the outputs 44.

What is desired, therefore, is an effective electrical measurement system.

BRIEF DESCRIPTION OF THE DRAWINGS

FIG. 4 illustrates a perspective view of an exemplary embodiment of a support for a set of current sensors.

FIG. 5 illustrates a side view of the support and sensors of FIG. 4.

FIG. 6 illustrates a top view of the support and sensors of FIG. 4.

DETAILED DESCRIPTION OF THE PREFERRED EMBODIMENTS

Figure 1:
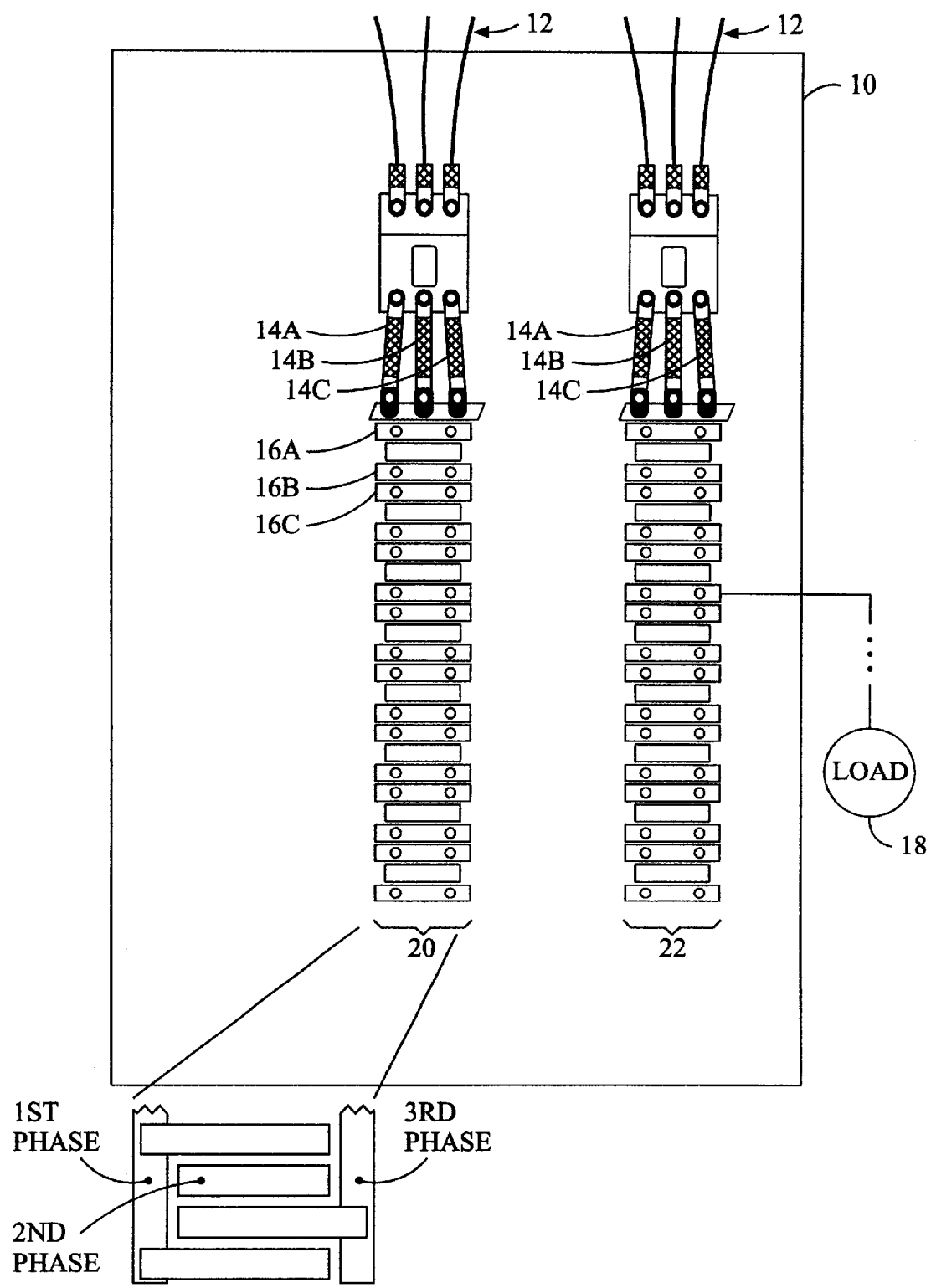
FIG. 1 illustrates a power panel with circuit breakers.
Figure 2:
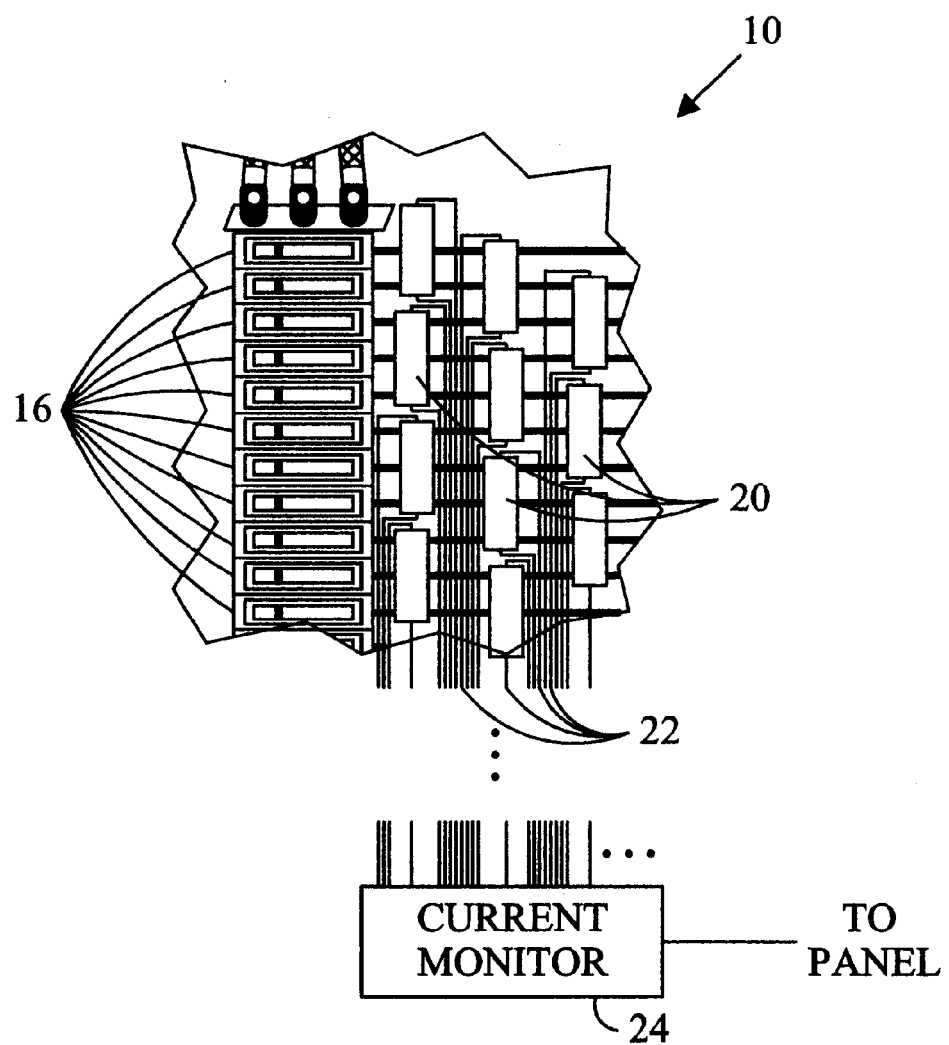
FIG. 2 illustrates circuit breakers and associated sensors.
Figure 3:
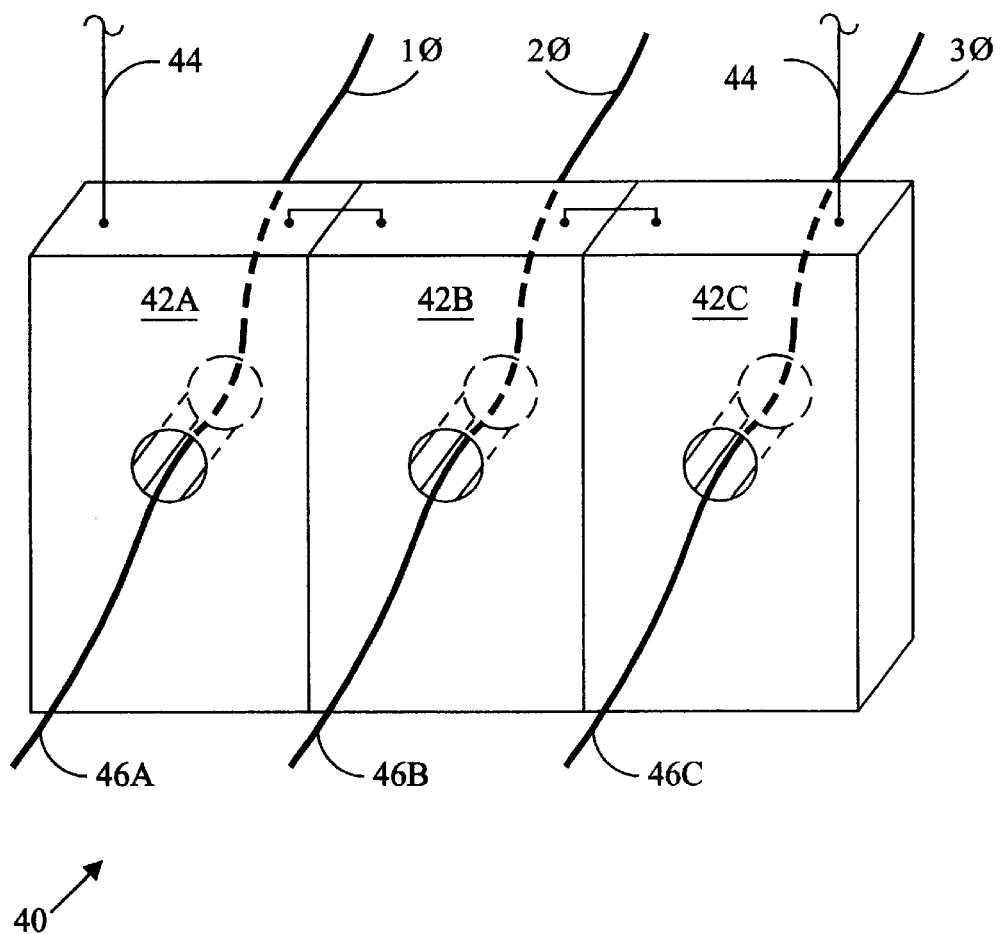
FIG. 3 illustrates a three phase sensor.

The present inventors reflected on the limitations inherent to using multiple current sensors for a set of circuit breakers within the power panel 10 and considered enclosing respective pairs of wires 22 in a single wire wrap to reduce the likelihood of mixing respective pairs together. Also, color coding of the respective pairs of wires 22 and corresponding color coding of the respective current sensors 20 would likewise reduce the likelihood that respective wires 22 and current sensors 20 would be mismatched. While such an arrangement is an improvement the present inventors still consider it burdensome to install multiple such sensor/wire combinations, relatively expensive, and remains prone to some likelihood of installation error. After considering the aforementioned limitations and potential improvements, the present inventors came to the realization that a set of current sensors maintained in a fixed spatial relationship with respect to one another permits a significantly increased number of current sensors to be included in the limited space available within the power panel 10. Moreover, sensors maintained in a fixed spatial relationship may decrease the likelihood of installation errors by technicians.

Referring to FIG. 4, a set of sensors 60 may be supported by a support 62 which maintains the current sensors 60 in a fixed spatial relationship with respect to one another. Preferably the support 62 is rigid or semi-rigid, while a flexible support 62 that was installed on a rigid or a semi-rigid supporting member(s) may likewise be used. The sensors 60 are preferably current sensors, or alternatively, voltage sensors or power sensors. The sensors 60 are preferably wire wound torodial coils on a metallic or nonmetallic core enclosed within a plastic housing through which a wire 63 may be extended, and the housings are at least partially surrounding the respective coil. Changing current within the wire 63 induces a changing magnetic field around the wire 63. The changing magnetic field in turn induces a changing current within the wire wound torodial coil. The changing current within the torodial coil may be used directly or converted to any suitable signal, such as for example, a voltage signal, a power level signal, a different current signal, an open circuit condition, and a short circuit condition.

The openings 64 defined by the sensors 60 are preferably oriented in a substantially parallel relationship with respect to each other and/or oriented in a substantially perpendicular relationship with respect to the longitudinal axis 66 of the support 62 or otherwise the general alignment of the sensors. Preferably, one set of the aligned sensors have a first linear arrangement and another set of the aligned sensors have a second linear arrangement, which may be parallel to each other. Also, preferably at least two of the aligned sensors have a first linear arrangement and at least two others of the aligned sensors have a second linear arrangement. A single aligned set of sensors 60 may be used or more than two sets of sensors 60 may be used, as desired.

Referring also to FIG. 5, the sensors 60 may be arranged such that the housings surrounding the current sensors have an overlapping region 70 in a substantially perpendicular direction with respect to the longitudinal axis of the support 62 and/or general alignment of the sensors. Preferably, the openings 64 defined by the sensors 60 are in a non-overlapping relationship 72 with respect to one another and a non-overlapping relationship 74 with respect to other housings. This permits the current sensors to be arranged in a more compact arrangement within the power panel.

Referring also to FIG. 6, a respective transient voltage suppressor 80 may be interconnected in parallel across the output terminals of each sensor 60. The transient voltage suppressors 80 limits the voltage build up at the terminals of the sensors 60, which may occur if the sensors are sensing a changing magnetic field while the terminals of the sensors 60 are open circuited. This decreases the likelihood that technicians will be the recipient of an unanticipated electrical shock.

Figure 7:
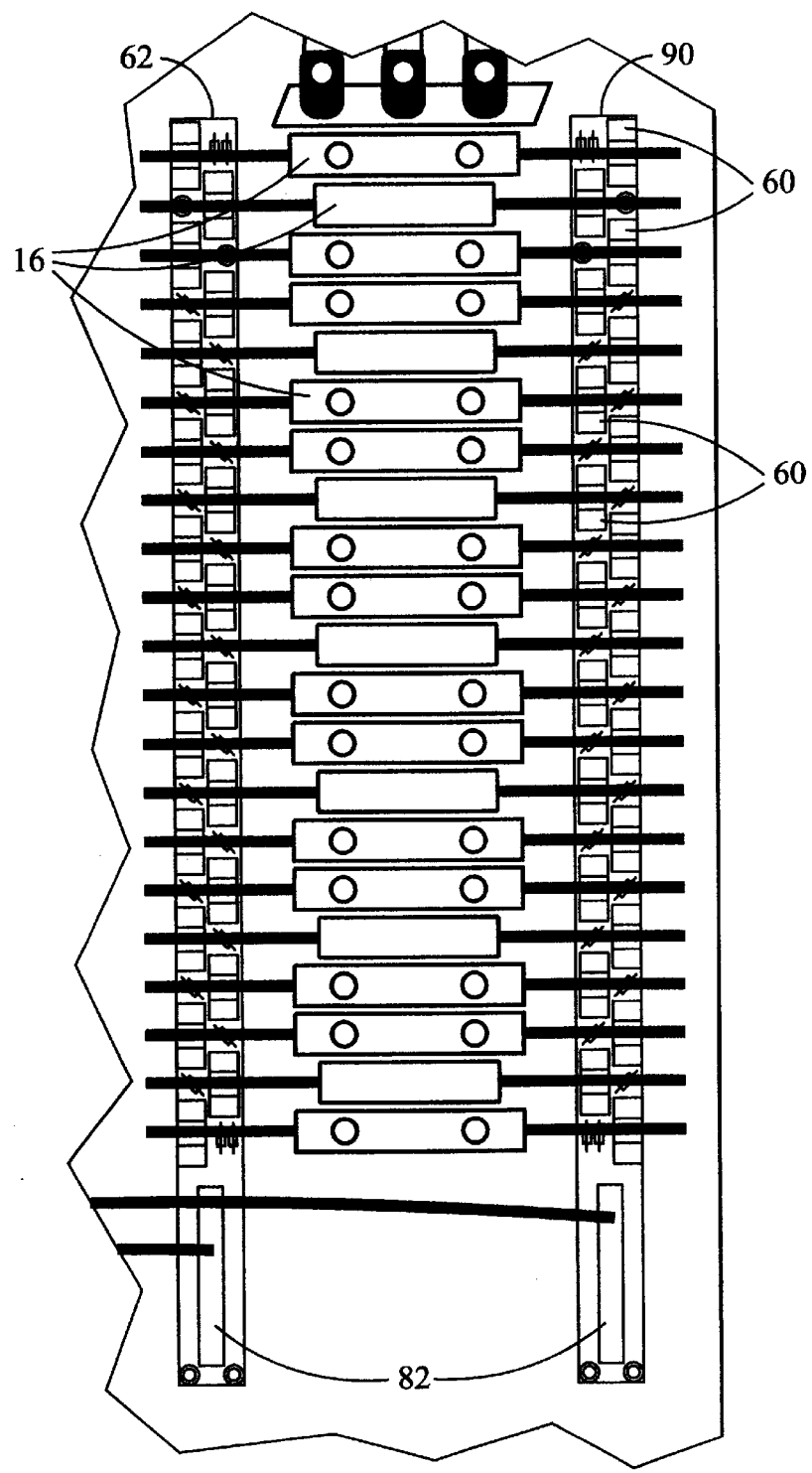
FIG. 7 illustrates a top view of the support and sensors of FIG. 4 together with circuit breakers.

Referring to FIG. 7, the current sensors 60 are preferably arranged in a spatial arrangement such that the openings 64 defined by the current sensors 60 are in a substantially directly opposing relationship with respect to the circuit breakers 16. In other words, each of the openings 64 is opposing a respective circuit breaker 16. In this manner, the wires from the circuit breakers 16 may be readily routed through a respective sensor 60.

Figure 8:
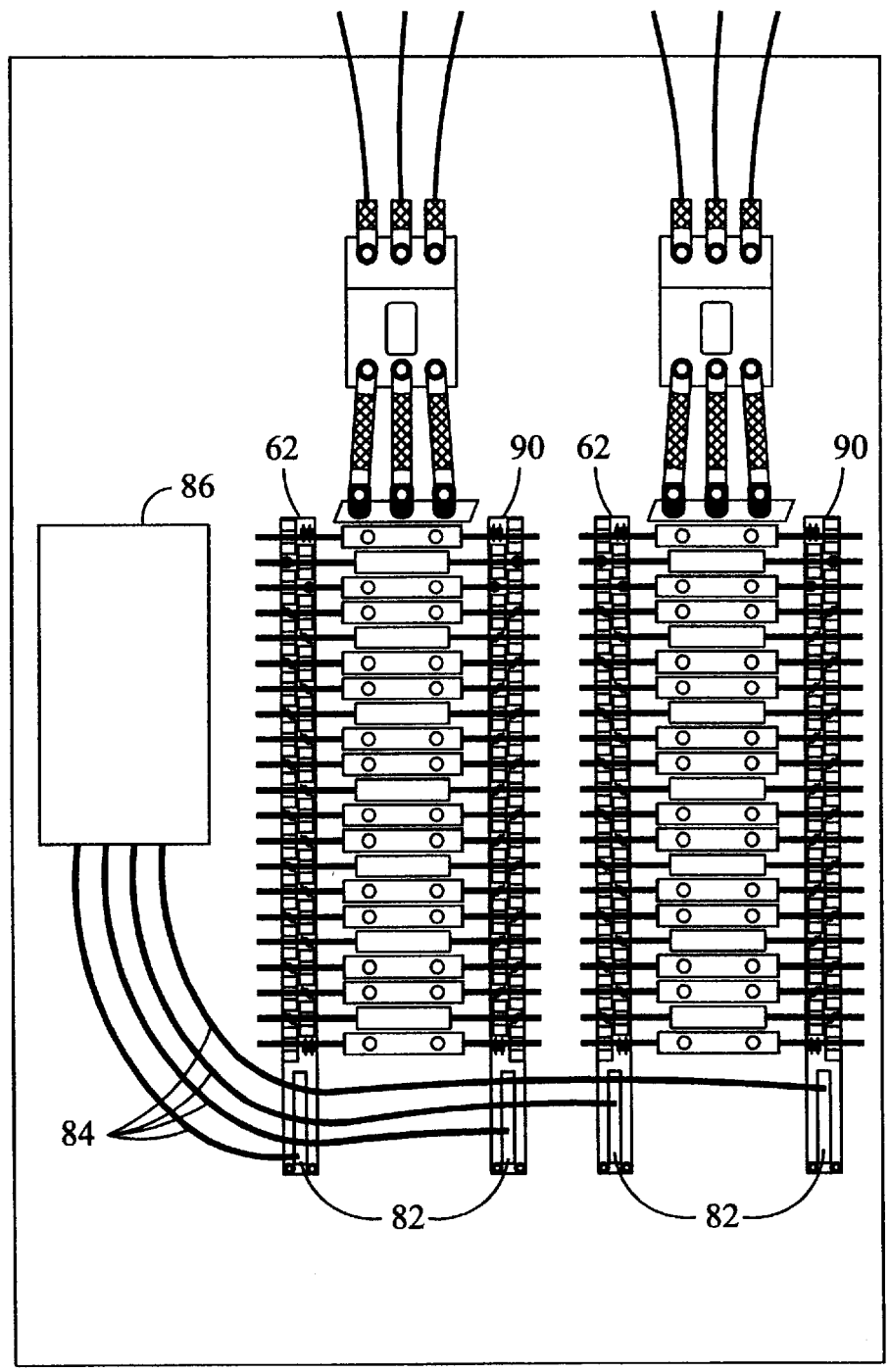
FIG. 8 illustrates a power panel assembly with a current monitor and the support/current sensors of FIG. 4.
Figure 9:
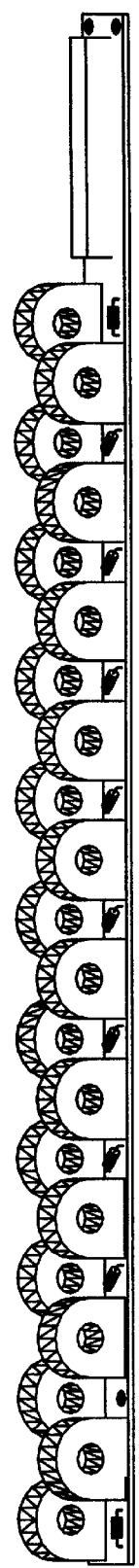
FIG. 9 illustrates a perspective view of another exemplary embodiment of a support for a set of current sensors.
Figure 10:
FIG. 10 illustrates a side view of the support and sensors of FIG. 9.
Figure 11:
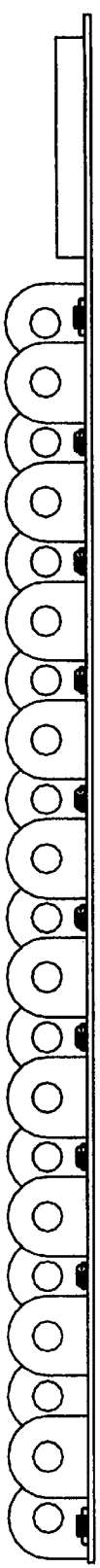
FIG. 11 illustrates a top view of the support and sensors of FIG. 9.

Referring to FIG. 8, during normal installation the support 62 is initially affixed within the power panel in an adjacent spaced apart relationship with respect to a set of circuit breakers 16. A support may be located on both sides of a set of circuit breakers 16, if desired. Another support is illustrated in FIGS. 9, 10, and 11 suitable for the right hand side of the circuit breakers (FIGS. 4, 5, and 6 are suitable for the left hand side). Then, the wires from the loads are passed through the respective sensors and interconnected to a respective circuit breaker 16. In this manner, the installation of the circuit breakers is efficient, less expensive, economical, and the sensors are in a suitable position with respect to the respective circuit breakers. The support 62 may be suitable for supporting a set of electrical traces that interconnect the sensors 60 to a connector 82. The interconnection from the sensors 60 to the connector 82 are predetermined so that the signals provided to the connector 82 are readily identifiable to the proper sensor 60. This eliminates the potential possibility of improperly interconnecting the wires from the sensors 60 to the connector. A cable 84 interconnects each connector 82 to a current monitor 86. While such a set of supports 62 with respective sensors 60 are suitable for use with new installation, it is difficult to install such a set of sensors 60 to an existing set of circuit breakers with wires already installed. To permit the sensors 60 to be readily interconnected with wires already interconnected to the circuit breakers 16 the sensors 60 may be constructed in a split-core manner. In this manner, the opening 64 may be opened, the wire inserted therein, and the opening 64 closed around substantially all of the wire.

To provide effective monitoring of the current levels provided to the loads, the current monitor 86 may monitor the current levels of each of circuit breakers 16. For example, a circuit breaker may be sized to trip at current levels in excess of 50 amps. Different circuit breakers may likewise be sized to trip at different levels. Accordingly, the current monitor 86 permits setting the trip level for each of the circuit breakers, many of which may be different. The current monitor may provide a warning when a sensor senses a current level greater than a predetermined statistical measure of the trip value of the current sensor, such as 70%. This provides a warning to the operator that the loads on a particular circuit breaker are reaching the maximum levels. The current monitor may also provide an alarm when a sensor senses a current level greater than a greater predetermined statistical measure of the trip value of the current sensor, such as 80%. This provides an alarm condition to the operator that the loads on a particular circuit breaker are nearly at the maximum level and a reduction in the current requirements of the loads or otherwise the removal of a load is desirable. Similarly a low current warning, and a low current alarm may likewise be included. Normally, the low current warning and alarms indicate a defective breaker and whether the loads are turned off. The warnings and alarms may include a time component, such that the warning or alarm condition needs to be present for a period of time before the warning or alarm condition is activated.

The current monitor 86 may likewise be used to provide reasonable power sub-metering. The voltage levels are generally known, such as 110 or 120 volts at 50 or 60 hertz. Likewise, the power factor may be presumed to be a constant value or unity ("1"). The measured current levels from the sensor may be multiplied by the presumed voltage to determine the power. While not as accurate as having a true power monitoring system that measures the actual current and the actual voltage, together with the power factor, it does provide an indication as to the power being supplied to each load(s).

The current monitor 86 may likewise be used to monitor the load balance between the different phases of the power panel 10. Frequently, the circuit breakers may be interconnected to a single phase when the loads require 120 volts, interconnected to two phases when the loads require 240 volts, and interconnected to three phases when the loads require three phase power. For example, the first phase of the power panel 10 may be supplying 70 amps, the second phase of the power panel 10 may be supplying 30 amps, and the third phase of the power panel 10 may be supplying 150 amps. This significant imbalance in the current supplied by the different phases is sub-optimal. For example, the greater the current levels the greater the voltage drop from the power source to the power panel, which may result in significant variations in the voltage levels provided to the power panel from the three phase power source. By monitoring the current (or power) provided from each phase using the sensors, the loads may be redistributed between the different phases to re-balance the loads.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. An electrical sensing device comprising:
   (a) a support suitable for being supported within a power panel;
   (b) at least four sensors each defining an opening through which a wire may be extended; and
   (c) said sensors being supported by said support in a fixed spatial relationship.

2. The device of claim 1 wherein each of said sensors includes a wire wound torodial core.

3. The device of claim 1 wherein said openings of said sensors are oriented in a substantially parallel relationship with respect to each other.

4. The device of claim 1 wherein said support has a longitudinal axis and said openings of said sensors are substantially perpendicular to said longitudinal axis of said support.

5. The device of claim 1 wherein said openings of said sensors are oriented in a substantially perpendicular relationship with respect to the general alignment of said sensors.

6. The device of claim 1 wherein said sensors are aligned in only one substantially linear arrangement.

7. The device of claim 1 wherein said sensors are aligned in at least two substantially co-linear arrangements.

8. The device of claim 7 wherein at least two of said aligned sensors have a first linear arrangement and at least two others of said aligned sensors have a second linear arrangement.

9. The device of claim 1 wherein each of said sensors are maintained in a spatial arrangement opposed to respective circuit breakers.

10. The device of claim 1 wherein said sensors are arranged such that a respective housing at least partially surrounding each of said sensors has an overlapping region in a substantially perpendicular direction with respect to at least one of a longitudinal axis of said support and the general alignment of said sensors.

11. The device of claim 1 wherein said openings of said sensors are arranged in a non-overlapping relationship with respect to other said openings in a substantially perpendicular direction with respect to at least one of a longitudinal axis of said support and the general alignment of said sensors.

12. The device of claim 1 wherein said openings of said sensors are arranged in a non-overlapping relationship with respect to respective housings at least partially surrounding each of said sensors in a substantially perpendicular direction with respect to at least one of a longitudinal axis of said support and the general alignment of said sensors.

13. The device of claim 1 further comprising
   (a) a power panel;
   (b) a plurality of circuit breakers within said power panel;
   (c) said device within said power panel; and
   (d) said sensors arranged in a spatial arrangement such that said openings defined by said sensors are in a substantially directly opposing relationship with respect to respective ones of said circuit breakers.

14. The device of claim 1 wherein said sensors are split core sensors.

15. The device of claim 1 further comprising
   (a) a connector supported by said support; and
   (b) a current monitor that receives a signal from said connector representative of the current levels of a wire sensed by one of said sensors.

16. The device of claim 15 wherein said current monitor estimates the power provided by said wire.

* * * * *